US008647797B2

(12) United States Patent
Ishii et al.

(10) Patent No.: US 8,647,797 B2
(45) Date of Patent: Feb. 11, 2014

(54) METHOS AND DEVICE FOR KEEPING MASK DIMENSIONS CONSTANT

(75) Inventors: Takaaki Ishii, Yokohama (JP); Tomas Hülsmann, Garching (DE); Tobias Hickmann, München (DE)

(73) Assignee: Suss Microtec Lithography GmbH, Garching (DE)

( * ) Notice: Subject to any disclaimer, the term of this patent is extended or adjusted under 35 U.S.C. 154(b) by 48 days.

(21) Appl. No.: 13/261,175

(22) PCT Filed: Aug. 6, 2010

(86) PCT No.: PCT/EP2010/061479
§ 371 (c)(1),
(2), (4) Date: Feb. 10, 2012

(87) PCT Pub. No.: WO2011/018418
PCT Pub. Date: Feb. 17, 2011

(65) Prior Publication Data
US 2012/0141928 A1  Jun. 7, 2012

(30) Foreign Application Priority Data

Aug. 11, 2009  (DE) .......................... 10 2009 036 953
May 12, 2010  (DE) .......................... 10 2010 020 324

(51) Int. Cl.
*G03F 9/00*  (2006.01)

(52) U.S. Cl.
USPC .................. 430/30; 430/330; 355/30; 355/53

(58) Field of Classification Search
USPC ................................ 430/30, 330; 355/30, 53
See application file for complete search history.

(56) References Cited

U.S. PATENT DOCUMENTS

| 5,593,800 | A | 1/1997 | Fujioka et al. |
| 5,604,779 | A | 2/1997 | Amemiya et al. |
| 6,342,941 | B1 | 1/2002 | Nei et al. |
| 6,455,821 | B1 | 9/2002 | Stumbo |
| 6,825,913 | B1 | 11/2004 | Schuster et al. |
| 2003/0179354 | A1 | 9/2003 | Araki et al. |
| 2004/0053169 | A1 | 3/2004 | Kindt |

FOREIGN PATENT DOCUMENTS

| DE | 2844368 A1 | 4/1980 | ................ G03F 7/26 |
| JP | 05-114541 | 5/1993 | ............ H01L 21/027 |
| JP | 2004/039905 | 2/2004 | ............ H01L 21/027 |

*Primary Examiner* — Christopher Young
(74) *Attorney, Agent, or Firm* — Ohlandt, Greleey, Ruggiero & Perle, L.L.P.

(57) ABSTRACT

The present application describes a method and a device for keeping the mask dimensions of a mask (6) constant in the mask plane in lithography. The mask (6) is heated due to the exposure during lithography. By means of thermal and/or mechanical methods, the dimensions of the mask (6) are kept constant. It is possible to use additional methods or devices, e.g. an air cooler (17) or an air heater (17), in order to prevent a change in the mask dimensions in the mask plane.

29 Claims, 2 Drawing Sheets

METHOS AND DEVICE FOR KEEPING MASK DIMENSIONS CONSTANT

This Patent Application is a US National Phase Patent Application from PCT Application No. PCT/EP2010/061479, filed Aug. 6, 2010 and claiming priority from German Patent Application Nos. 10 2009 036 953.8, filed Aug. 11, 2009 and 10 2010 020 324.6, filed May 12, 2010.

FIELD OF THE INVENTION

The present invention relates to a method and a device for keeping the mask dimensions of a mask constant in lithography, e.g. shadow casting exposure, and in particular to a method and a device in which the dimensions of the mask are kept constant in order to prevent a thermally-induced drift of the exposed areas on the substrate caused by the mask.

BACKGROUND TO THE INVENTION

In exposure systems in lithography, the temperature of the individual elements of such a device is a critical parameter. Above all, the temperature of the substrate and the mask should be as constant as possible. The change in the temperature of the respective elements of the device leads to a change in the dimensions of the elements. This might lead to errors during the exposure of a substrate. The temperature of the substrate can be well adjusted and controlled through the substrate support. It is desirable that the dimensions of the mask remain constant when the substrate is changed and also between the individual exposure phases. However, exposure of the substrates heats the mask.

EP 0 940 718 A2 teaches to cool the mask by means of air. However, air cooling or air heating normally changes the temperature of the mask only slowly. The speed at which the temperature of the mask can be changed depends decisively on the thermal gradient between mask and air as well as on the air conduction. The higher the thermal gradient and the stronger the heat flow, the greater the temperature change of the mask. Air cooling with normal parameters, however, cannot react quickly enough to the temperature change and thus the change in the mask dimensions.

US 2004/0053169 A1 describes a method for minimizing the thermal gradient in a mask used in extreme ultraviolet lithography and which is arranged at a relatively large distance from the wafer to be exposed and which is heated by a heat source radiating from the front and cooled by a cooling device facing away from the wafer and contacting the rear of the mask.

U.S. Pat. No. 6,342,941 B1 describes a projection exposure method in which the mask is preheated before exposure up to a thermal expansion saturation point on the basis of pre-calculated data.

Further prior art is known from US 2003/0179354 A1, U.S. Pat. No. 5,593,800 A and DE 28 44 368 A1.

SUMMARY OF THE INVENTION

In view of the above-mentioned problems of the prior art, it is an object of the present invention to provide a device and a method for keeping the mask dimensions constant before, during and after exposure and in particular also after a substrate change. It is a further object to provide one or more sufficiently quick compensation mechanisms which quickly compensate for the possibly changed dimensions of the mask caused by exposure. These and further objects are achieved by the features of the claims.

In achieving these objects, the invention starts out from the following basic idea: The dimensions of a mask in the mask plane during the lithography of a substrate are kept constant during an exposure phase or a non-exposure phase by thermal effects, e.g. heating or cooling the mask, and/or mechanical effects, e.g. expanding or compressing the mask.

The device for exposing the substrate, in particular a wafer, comprises an exposure source, a measuring device and a heater and/or cooler. During exposure, the mask forms an image of an optical structure on the substrate. During an exposure phase, the substrate is exposed. The exposure radiation causes the mask to be heated in an undesired manner. During a non-exposure phase, the exposure source is switched off. Thus, the mask cools down again during the non-exposure phase. A measuring device continuously measures the temperature and/or the dimensions of the mask. A heater can be used for heating the mask during the non-exposure phase, so that the temperature and thus also the dimensions of the mask remain constant. Alternatively, the dimensions of the mask in the mask plane can also be kept constant in that the mask is cooled during the exposure phase.

Instead of or in addition to heating or cooling the mask, a mask expansion device and/or mask compression device can be used for keeping the dimensions of the mask constant despite a possible temperature change. In particular, the mask is expanded during the non-exposure phase and compressed during the exposure phase.

The heater for heating the mask can be configured in different ways. Preferably, a radiant heater operating in the spectral range of infrared radiation or microwave radiation is used. The radiation of the radiant heater, however, must not expose the photoresist on the substrate.

This can be achieved by causing the radiation of the radiant heater to hit the mask in an inclined manner so that the heat radiation transmitted through the mask goes past the substrate.

The emission of the radiant heater on the mask can also be perpendicular with respect to the mask plane in the direction of the substrate. In this case, the radiation of the radiant heater must be absorbed completely in the mask or blocked in the radiation path before the substrate by means of a diaphragm or shutter so that the photoresist on the substrate is not exposed by the radiant heater.

According to a further alternative embodiment of the invention, the wavelength of the heat radiation lies outside the sensitivity range of the photoresist and is, e.g., longer than about 500 nm. In this case, the radiation can extend perpendicularly with respect to the mask plane and thus does not have to be blocked by a shutter.

It is also possible to use a heater which is in contact with the mask. The direct contact leads to a good heat transfer. A device having a gap between mask and heater is also possible because of the heat conduction properties of the air. An induction heater by means of which electrically conductive layers of the mask can be heated can be used as well. A further possibility is an ultrasonic heater.

The mask can also be heated by means of heat conductors. The heat conductors are attached either directly to the mask or to a glass plate which is brought in thermal contact with the mask. It is possible to form a plurality of heating circuits by means of the heat conductors, so that individual parts of the mask can be heated differently.

In addition to the above methods for keeping the dimensions of the mask constant, it is also possible to use further methods either individually or in combination.

During the exposure phases, the substrate is placed on a substrate support through which the temperature of the substrate can be controlled, so that also the dimensions of the substrate can be controlled. If the mask is in contact with the substrate in case of a contact exposure procedure or arranged only slightly above the substrate (in case of the proximity exposure procedure), it can also be heated and/or cooled by the substrate support.

During rest periods of the device of the present invention, there can be relatively long time periods during which no substrate is placed on the substrate support. During these time periods, the substrate support can be brought in direct thermal contact with the mask in order to cool or heat the mask by direct contact with the substrate support.

The mask can be cooled and heated by air. The temperature of the mask can also be controlled by a mask holder. Preferably, a mask material having only a small thermal expansion coefficient is used. Electrically conductive layers of the mask with current flowing in these layers can be used for heating the mask.

BRIEF DESCRIPTION OF THE DRAWINGS

In the following, the invention will be explained in more detail on the basis of the drawings in which.

DETAILED DESCRIPTION OF THE INVENTION

Figure 1:
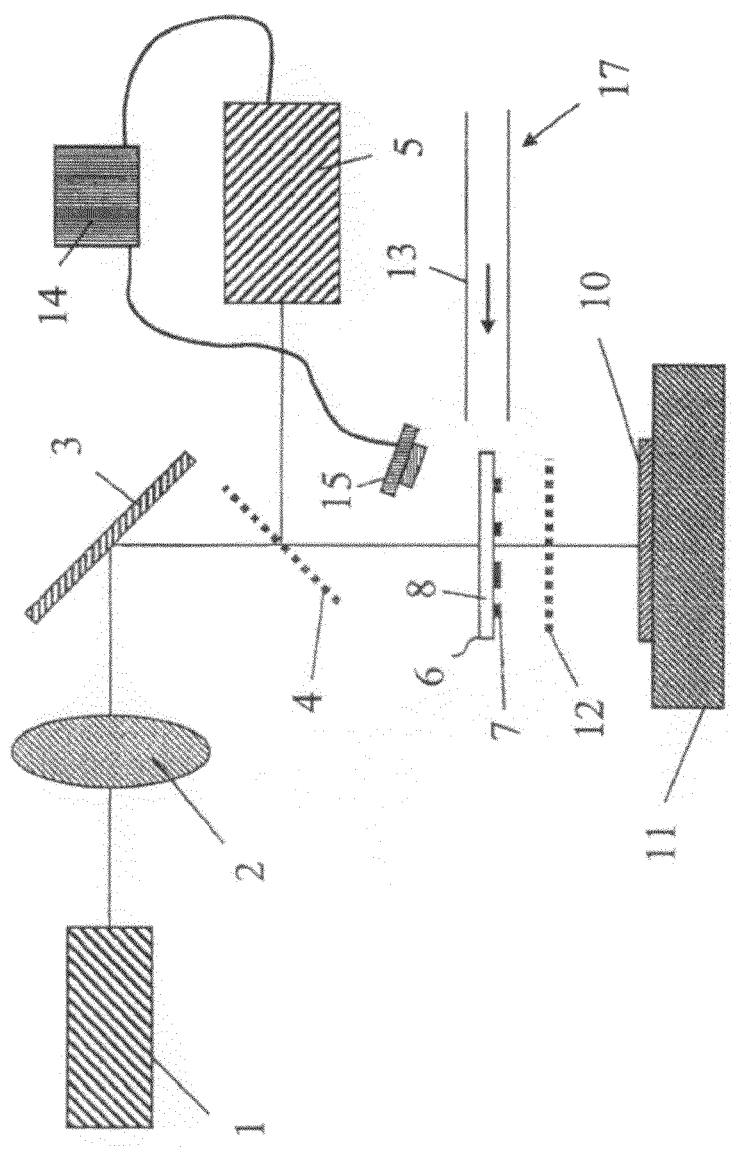
FIG. 1 is a schematic illustration of a device according to the invention in which the dimensions of the mask for lithography are kept constant by means of a heater.

FIG. 1 shows a device according to the invention for exposing a substrate 10, in particular a wafer. The device comprises an exposure source 1 whose emission hits a mask 6 via an optical imaging system 2 and a deflection mirror 3. The mask 6 comprises a carrier material 8 which is transparent to the used wavelength of lithography and non-transmitting structures 7, e.g. of chromium. The carrier material 8 is made of, e.g., quartz, soda lime or borosilicate.

In case of projection exposure, a projection lens (not shown) arranged between the mask 6 and the substrate 10 forms images of the structures 7 on the substrate 10 and/or on the photoresist (not shown) on the substrate 10.

In case of shadow casting exposure, such a projection lens is not provided. Rather, the mask is in contact with the substrate (contact exposure) or slightly spaced from the substrate (proximity exposure), as schematically shown in FIG. 1.

The substrate 10 is held by a substrate support 11 and is thus thermally connected thereto. Therefore, the temperature and thus the dimensions of the substrate 10 can be controlled through the substrate support 11.

The dimensions of the mask 6 or the substrate 10 are critical parameters in lithography. If the dimensions of one of these elements or of both elements change, erroneous images of the structures 7 can be formed on the substrate 10. In order to prevent this, the dimensions of mask 6 and substrate 10 must be kept almost constant. In case of the substrate 10, this can be achieved easily by controlling the temperature of the substrate support 11. In lithography, exposure phases, in which the emission of the exposure source 1 hits the mask 6, alternate with non-exposure phases, in which no emission of the exposure source 1 hits the mask 6. Non-exposure phases are, e.g., time periods in which the substrate 10 is changed. During an exposure phase, the mask 6 is heated by the emission of the exposure source 1 because part of the emission of the exposure source is absorbed in the mask 6. During this heating the mask 6 will expand. In the subsequent non-exposure phase the mask 6 emits heat to its environment. Thus, the dimensions of the mask 6 are reduced again. In particular, the so-called "run-out", i.e. the change in the position of the images of the structures formed on the substrate 10 due to the heating during subsequent exposure cycles, should be limited to, e.g., 0.25 µm in order to keep the lithography errors small.

By means of the radiant heater 5 shown in FIG. 1, the dimensions of the mask 6 can be kept almost constant. To this end, the changes in the dimensions of the mask 6 are measured by a measuring device 15 and evaluated by a control means 14. Alternatively, also the change in the temperature of the mask 6 can be measured. Based on the changes in the temperature, the changes in the dimensions of the mask 6 are then calculated by the control means 14. The control means 14 controls the emission of the radiant heater 5 in order to keep the dimensions constant over the exposure and non-exposure phases.

The radiation of the radiant heater can be directed by a deflection mirror 4 perpendicularly onto the mask 6. If the deflection mirror 4 is in the radiation path of the exposure source 1, the deflection mirror 4 must be moved out of the radiation path during each exposure phase. Alternatively, the deflection mirror 4 is transparent at the wavelength of the exposure source 1, e.g. in the ultraviolet range, and reflective in the wavelength range of the radiant heater 5, e.g. in the infrared range or in the microwave range. If the mask 6 does not absorb the emission of the radiant heater 5 completely, a diaphragm or shutter 12 is preferably provided in the radiation path between mask 6 and substrate 10 for interrupting the part of the emission of the radiant heater 5 transmitted through the mask 6 during the operating phase of the radiant heater 5, so that this part of the emission cannot act or acts as little as possible on the photoresist (not shown) on the substrate 10.

Alternatively, the radiant heater can also be used without deflection mirror. In this case, the radiant heater itself is swiveled during the non-exposure phase into the radiation path and activated.

The radiant heater 5 keeps the temperature of the mask 6 constant. To this end, the emission of the radiant heater 5 can be controlled by means of a measuring device 15 and a control means 14, as described above. Alternatively, the absorbed power of the emission of the radiant heater 5 in the mask 6 can be adjusted once to the absorbed power of the emission in the exposure source 1 in the mask 6. The radiant heater 5 then emits during the non-exposure phases constantly with this determined power in order to keep the temperature of the mask 6 during the non-exposure period possibly at the same temperature value as during the exposure phase, i.e. as constant as possible.

As shown in FIG. 1, it is possible to additionally use an air heater and/or air cooler 17. To this end, a hot or cold gas, e.g. from a tube 13, circumcirculates the mask 6. Since an air heater and an air cooler 17 change the temperature of the mask 6 in general only relatively slowly, they are preferably used for compensating slowly changing temperature variations of the mask 6.

Alternatively to the embodiment of the present invention shown in FIG. 1, the mask 6 can also be in direct contact with the substrate 10. Images of the structures 7 are formed directly on the substrate. Mask 6 and substrate 10 are then in thermal contact with each other. Therefore, it is possible to control the temperature of the mask 6 and thus also the dimensions of the mask 6 additionally by the substrate support 11.

There are also different approaches for keeping the dimensions of the mask 6 constant, e.g. by ultrasonic heating, induction heating or heating by current flow, in case the mask 6 comprises electrically conductive layers, and heating by a contact or almost-contact heater. In case a medium heater is used, a gas or liquid circumcirculates the mask 6 in order to cool or heat it.

In accordance with a specific embodiment of a contact heater, heat conductors are vapor deposited on the mask 6 or applied thereto in any other manner. By means of sensors, which are also vapor deposited on the mask 6 or applied thereto in any other manner, the heat energy emitted to the mask 6 can be controlled in order to keep the mask temperature constant. When the mask 6 is exposed, the emission of the heat energy by the heat conductors to the mask 6 is reduced or stopped. To this end, the applied layers must be sufficiently UV transmissive and must not scatter the light used for lithography.

For financial reasons, the mask 6 is preferably not changed. In this case, the heat conductors and the temperature sensors can be vapor deposited onto a glass plate or applied thereto in any other manner. The glass plate is then brought in thermal contact with the mask 6.

A plurality of separate heating circuits can be formed by means of the heat conductors. This has the advantage that individual parts of the mask 6 can be heated differently. The mask can thus be better adapted in order to achieve an optimum lithography result.

As an alternative or in addition to heating the mask 6 in the non-exposure phase, the mask 6 can be cooled in the exposure phase. To this end, the cooler is preferably brought in contact with the mask 6 in order to guarantee a good heat transfer.

Heating the mask 6 by absorption of the radiation energy of the exposure source 1 does not only lead to a change in the dimensions of the mask but in general also to an additional alignment error. The additional alignment error is due to the fact that the thermal expansion generally does not start from the center of the mask 6 because the reference point of the expansion of the mask 6 lies at an arbitrary point in the area of the mask 6 where the mask is held (e.g. by a suction holder using a vacuum). Also this additional alignment error can be avoided by the measures according to the invention for keeping the mask dimensions constant during the exposure and non-exposure phases.

Figure 2:
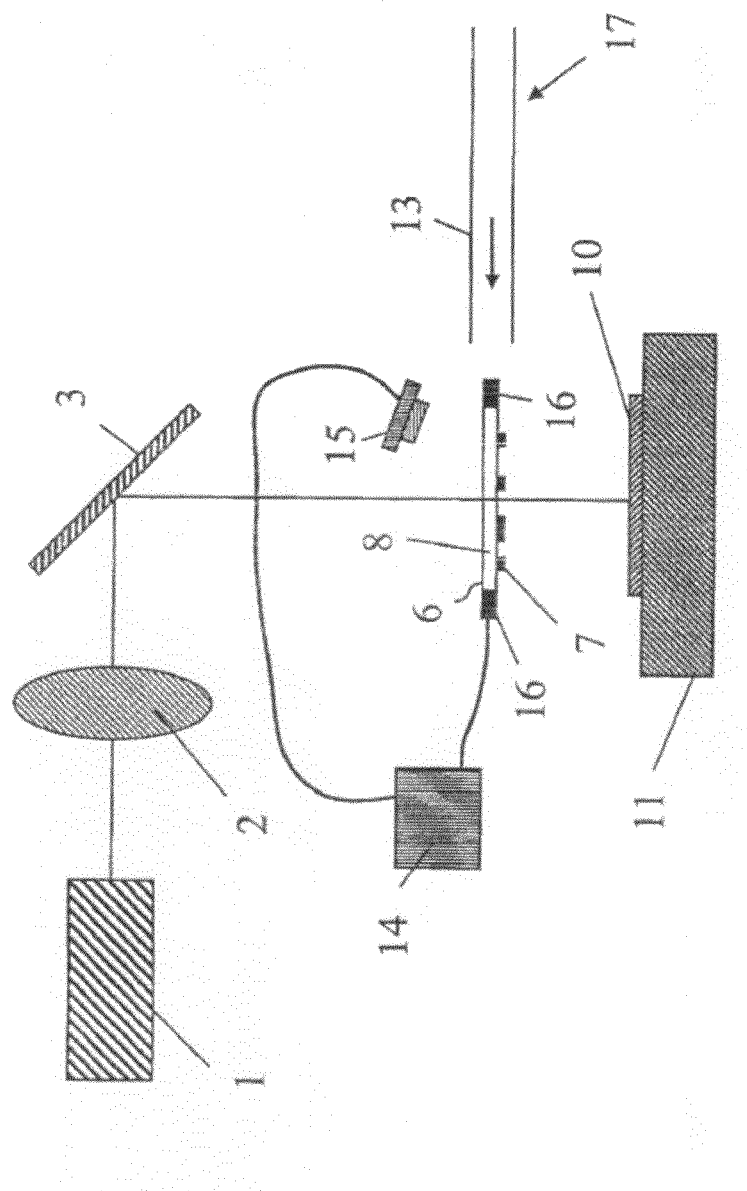
FIG. 2 is a schematic illustration of a further embodiment of the device according to the invention in which the dimensions of the mask for lithography are kept constant by means of a device for expanding and compressing the mask.

FIG. 2 shows a further embodiment of the present invention. Since it is very similar to the embodiment shown in FIG. 1, only the differences between the embodiments will be discussed here. According to FIG. 2, a mask expansion device 16 and/or mask compression device 16 acting in the mask plane is provided at the edge around the mask 6, e.g. in the form of a variable frame. For example in case of a temperature change, the mask 6 can be expanded or compressed in the mask plane by means of this device, so that the mask dimensions are kept constant. The mask expansion and/or mask compression device 16 is controlled by the control means 14. The mask expansion and/or mask compression device 16 can be combined with all the above methods for keeping the mask dimensions constant.

The invention claimed is:

1. A method for keeping the dimensions of a mask (6) constant in the mask plane during the shadow casting lithography of a substrate (10), in particular a wafer, the method comprising the steps of:
    (a) exposing the mask (6) by means of an exposure source (1) during an exposure phase, and
    (b) non-exposing the mask (6) during a non-exposure phase,
    (c) wherein during steps (a) and (b) at least one of temperature and dimensions of the mask (6) are measured and
    (d) wherein the mask (6) is mechanically compressed or expanded in at least one of step (a) and step (b) in order to keep the dimensions of the mask constant.

2. The method according to claim 1, wherein the mask (6) is cooled or heated by (i) direct contact of the mask (6) with a substrate support (11) or (ii) by direct contact of the mask (6) with the substrate (10) on the substrate support (14) at a small distance between the mask (6) and the substrate (10) the substrate (10) or the substrate support (11) respectively.

3. The method according to claim 1, wherein additionally the temperature of a mask holder is controlled for keeping the dimensions of the mask (6) constant.

4. The method according to claim 1, wherein a mask material having a small thermal expansion is used.

5. The method according to claim 1, wherein the temperature of the substrate (10) is controlled by the temperature of a substrate support (11) in order to reduce changes in the dimensions of the substrate (6) in the substrate plane.

6. The method according to claim 1 wherein the mask (6) is subjected to at least one of being heated in step (b) and cooled in step (a) in order to keep the temperature of the mask constant.

7. The method according to claim 6, wherein additionally at least one of an air cooler (17) and an air heater (17) is provided for at least one of cooling and heating the mask (6).

8. The method according to claim 6, wherein the mask temperature is kept constant by a radiant heater (5) by means of at least one of contact, almost-contact, medium, induction, ultrasound or radiation.

9. The method according to claim 8, wherein the emission of the radiant heater (5) on the mask (6) is in the direction of the substrate (10).

10. The method according to claim 9, wherein the radiation of the radiant heater (5) transmitted through the mask (6) is blocked by a shutter (12) between the mask (6) and the substrate (10).

11. The method according to claim 9, wherein the radiation of the radiant heater (5) is absorbed completely in the mask (6).

12. The method according to claim 6, wherein the mask (6) is heated by means of heat conductors applied thereto.

13. The method according to claim 6, wherein the mask (6) is heated through a glass plate comprising heat conductors.

14. The method according to claim 13, wherein individual parts of the mask (6) are heated differently by a plurality of separate heating circuits formed by heat conductors.

15. A device for exposing, in particular shadow casting exposing, a substrate (10), in particular a wafer, comprising:
    (a) an exposure source (1),
    (b) a mask (6) for optically forming images of a structure on the substrate (10),
    (c) a measuring device (15) for measuring at least one of temperature and dimensions of the mask (6), and
    (d) at least one of a mask mechanical expansion device (16) and a mask compression device (16) for keeping the dimensions of the mask constant.

16. The device according to claim 15, wherein the mask (6) comprises a material having a small heat expansion.

17. The device according to claim 15 comprising at least one of a radiant heater (5) and a cooler for keeping the temperature of the mask (6) constant.

18. The device according to claim 17, wherein the radiant heater (5) is selected from the group consisting of a contact, almost-contact, medium, induction, ultrasonic and radiant heater.

19. The device according to claim 18, wherein the radiant heater (5) operates in the wavelength range of the infrared or microwave radiation.

20. The device according to claim 19, comprising a shutter (12) in a radiation path between the mask (6) and the substrate (10) for selectively blocking the radiation of the radiant heater (5).

21. The device according to claim 17, wherein the mask (6) comprises electrically conducting layers for heating the mask by a current flowing through the mask (6).

22. The device according claim 17, comprising a mask holder for at least one of heating and cooling the mask (6).

23. The device according to claim 17, comprising at least one of an air cooler (17) and an air heater (17) for additionally performing at least one of the following cooling and heating the mask (6).

24. The device according to claim 17, comprising a substrate support (11) for holding as well as performing at least one of heating and cooling the substrate (10).

25. The device according to claim 24, comprising means for performing at least one of heating and cooling the mask (6) by thermal contact between substrate support (11) and substrate (10) and by thermal contact or slight distance between substrate (10) and mask (6) during lithography.

26. The device according to claim 24, comprising means for cooling or heating the mask (6) without substrate (10) during the rest periods by direct contact between substrate support (11) and mask (6).

27. The device according to claim 17, comprising heat conductors applied to the mask (6).

28. The device according to claim 27, comprising a plurality of separate heating circuits formed by heat conductors for performing at least one of selectively and differently heating individual parts of the mask (6).

29. The device according to claim 17, comprising a glass plate comprising heat conductors being in thermal contact with the mask (6).

* * * * *